(12) United States Patent
Chuah et al.

(10) Patent No.: US 10,701,796 B2
(45) Date of Patent: Jun. 30, 2020

(54) ELECTROMAGNETIC INTERFERENCE (EMI) SHIELD

(71) Applicant: Intel Corporation, Santa Clara, CA (US)

(72) Inventors: Tin Poay Chuah, Bayan Baru (MY); Yew San Lim, Penang (MY); Khai Ern Ke See, Pulau Pinang (MY); Khang Choong Yong, Puchong (MY); Kevin J. Byrd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/016,997

(22) Filed: Jun. 25, 2018

(65) Prior Publication Data

US 2019/0045621 A1  Feb. 7, 2019

(51) Int. Cl.
| | |
|---|---|
| H05K 9/00 | (2006.01) |
| H05K 1/02 | (2006.01) |
| G06F 1/18 | (2006.01) |
| H01L 23/552 | (2006.01) |
| G06F 1/16 | (2006.01) |
| H05K 3/46 | (2006.01) |

(52) U.S. Cl.
CPC ......... *H05K 1/0218* (2013.01); *G06F 1/1635* (2013.01); *G06F 1/1656* (2013.01); *G06F 1/182* (2013.01); *H01L 23/552* (2013.01); *H05K 9/0026* (2013.01); *H05K 9/0037* (2013.01); *H05K 9/0043* (2013.01); *H05K 9/0084* (2013.01); *H05K 3/4691* (2013.01); *H05K 2201/047* (2013.01); *H05K 2201/055* (2013.01); *H05K 2201/10371* (2013.01)

(58) Field of Classification Search
USPC .................................................. 361/816, 818
See application file for complete search history.

(56) References Cited

U.S. PATENT DOCUMENTS

| | | | |
|---|---|---|---|
| 5,031,027 A | 7/1991 | Dorinski et al. | |
| 5,107,989 A * | 4/1992 | Becker ................. | H05K 9/0067 206/720 |
| 6,570,086 B1 * | 5/2003 | Shimoji ............. | H05K 7/20445 174/377 |
| 6,870,094 B2 * | 3/2005 | Otaki ..................... | H01R 12/59 174/382 |

(Continued)

FOREIGN PATENT DOCUMENTS

| | | |
|---|---|---|
| DE | 102010041831 A1 | 4/2012 |
| EP | 2091308 A2 | 8/2009 |
| JP | 2012146823 A | 8/2012 |

OTHER PUBLICATIONS

Extended European Search Report in EP Patent Application No. 19175731.9 dated Nov. 7, 2019, 9 pages.

*Primary Examiner* — Hung S. Bui
(74) *Attorney, Agent, or Firm* — Patent Capital Group

(57) ABSTRACT

In embodiments, a device may include a single electromagnetic interference (EMI) shield plate that defines an enclosed area. The EMI shield plate may have an inner surface and an outer surface opposite the inner surface. The device may further include a first printed circuit board (PCB) coupled with the inner surface, wherein the first PCB is within the enclosed area. Other embodiments may be described and/or claimed.

19 Claims, 7 Drawing Sheets

(56) References Cited

U.S. PATENT DOCUMENTS

| | | | | |
|---|---|---|---|---|
| 7,248,484 | B2* | 7/2007 | Brooks | H05K 9/0084 |
| | | | | 174/51 |
| 8,787,037 | B2* | 7/2014 | Sakoda | H05K 9/0066 |
| | | | | 174/50 |
| 2006/0067070 | A1 | 3/2006 | Otsuki | |
| 2014/0252568 | A1* | 9/2014 | Hwang | H01L 23/552 |
| | | | | 257/659 |
| 2016/0192544 | A1 | 6/2016 | Aoki et al. | |
| 2016/0295700 | A1* | 10/2016 | Yu | H05K 1/181 |
| 2017/0238414 | A1* | 8/2017 | Ogawa | H05K 1/0281 |
| | | | | 361/679.55 |

* cited by examiner

Identifying a single EMI shield plate that includes a first surface with a PCB coupled thereto
305

Reshaping the EMI shield plate to form a reshaped single EMI shield plate that defines an enclosed area, wherein the PCB is within the enclosed area
310

ELECTROMAGNETIC INTERFERENCE (EMI) SHIELD

FIELD

Embodiments of the present disclosure generally relate to the field of electromagnetic interference (EMI) shielding.

BACKGROUND

On-board EMI shield parts may have one or more drawbacks. For example, on-board EMI shield parts may require PCB real estate for shielding tracks/mounting holes. EMI shield parts may suffer from warpage during manufacturing, or additional parts such as EMI gaskets may be needed. Some parts may require additional manufacturing steps such as solder reflow.

In some embodiments, the additional on-board shielding tracks and assembly requirements may occupy a relatively large board area, which may require a larger board width. The larger board width may come at the cost of battery size, thereby decreasing the overall battery life of a mobile device using the on-board shielding tracks. Mechanical mounted shielding can via mounting holes may have an even larger impact on the board width and routing.

DETAILED DESCRIPTION

Figure 1:
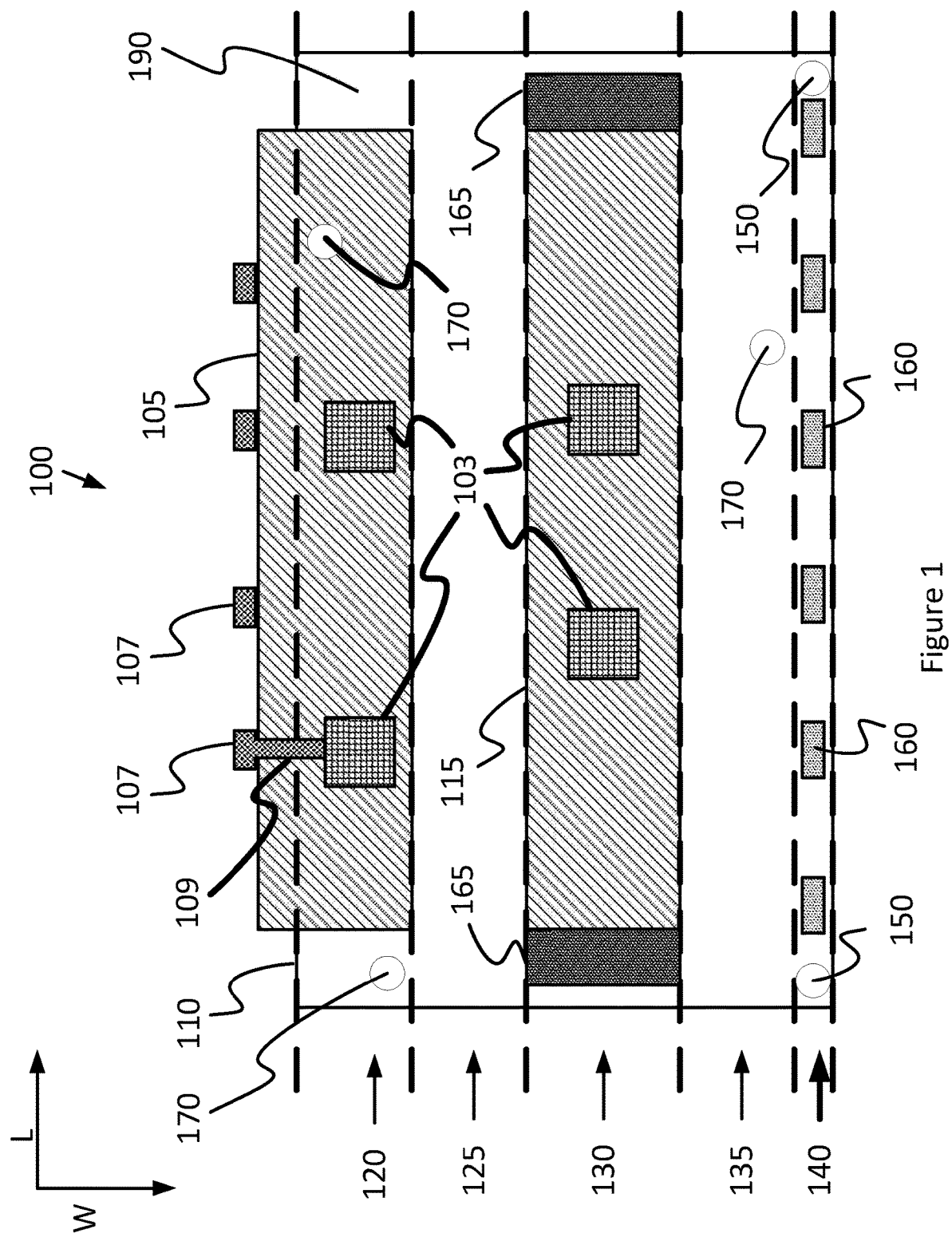
FIG. 1 illustrates a simplified top-down view of an example device prior to reshaping, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

Embodiments herein may relate to a robust EMI shielded wraparound technology which may use edge fingers/plating, guide holes, fiducial pads, or pre-bent flex edges. The EMI shielded wraparound technology may be combined with three-dimensional (3D) printed circuit board (PCB) technology to create an x/y/z space optimized solution that may enable smaller form factors for a shielded PCB.

More specifically, embodiments herein may relate to a built-in wraparound EMI shielding solution that may incorporate the folding of a 3D PCB technology to create a final assembled PCB assembly (PCBA) that is shielded in itself without the need for an additional on-board EMI shield. Generally, to achieve an EMI shielded wraparound PCBA, the outer most layer on the flex portion of a rigid-flex stackup may be used as an EMI layer that fold and wraps the inner components, for example, in a boxed-shape manner. Subsequently, the wrapped PCBA may then be robustly assembled together using a combination of edge finger pads, guide holes, fiducial parts, side EMI spacers, or pre-bent flex edge(s). In some embodiments, the components within the PCBA may be stacked on top of one another in the PCBA to achieve the thinnest possible configuration for the PCBA with a given set of components.

FIG. 1 illustrates a simplified top-down view of an example device 100, in accordance with various embodiments. Specifically, the device 100 may include a flexible portion 110 that are coupled with one or more rigid portions such as rigid portions 105 and 115. More specifically, the flexible portion 110 may be a flexible EMI shield portion, and the rigid portions 105 and 115 may be PCBs. In embodiments, the rigid portions 105 and 115 may be coupled with the flexible portion 110 via, for example, an adhesive, direct lamination, direct layer build-up, or some other manner. More specifically, the rigid portions 105 and 115 may be coupled with a surface of the flexible portion 110 via one of the techniques discussed above.

For example, in some embodiments the flexible portion 110 may be formed of a plurality of layers of material that may be coupled with one another via an adhesive material (glue, epoxy, etc), deposited directly onto one another, or otherwise layered upon one another. The layers may include, for example, signal layers, ground layers, power layers, etc. The flexible portion 110 may further include one or more layers of a flexible copper clad laminate (FCCL) which may be, for example, copper and a polyimide. In some embodiments an outer surface of the flexible portion 110 may include an EMI shield portion (not shown in FIG. 1 as it would be on the opposite side of the device 100 than shown in FIG. 1) that may include a flexible EMI-blocking material such as aluminum or copper. In some embodiments, the flexible portion 110 may have a thickness (which may also be referred to as z-height) of approximately 0.28 millimeters (mm). In other embodiments the flexible portion 110 may have a thickness of between approximately 0.07 mm and approximately 0.42 mm. Generally, the thickness of the flexible portion 110 may be based on a number of factors such as design considerations of the platform in which the device 100 may be used or other factors, so the flexible portion 110 may be thicker or thinner.

Similarly, the rigid portions 105 or 115 may include a plurality of layers of material that may be coupled with one another via an adhesive material, deposited directly onto one another, or otherwise layered upon one another. The layers may include, for example, signal layers, ground layers, power layers, etc. In some embodiments the rigid portions may be PCBs with a core, or coreless PCBs. The PCBs may include one or more components 103 dispositioned thereon. For example, the PCBs may include components 103 such as a memory, a processor, a storage, a graphics chip, or some other type of component. In embodiments, the rigid portions 105 or 110 may have a thickness of approximately 0.41 mm, while in other embodiments the rigid portions 105 or 110 may have a thickness between approximately 0.4 mm and approximately 1 mm. In some embodiments rigid portion 105 may have the same thickness as rigid portion 110, while in other embodiments the rigid portions 105 and 110 may have different thicknesses. Similarly to the flexible portion 110, the thickness of the rigid portions 105 or 110 may be based on a number of factors such as design considerations of the platform in which the device 100 may be used, the number/types of components on the PCB, or some other factor.

In some embodiments, the device 100, and specifically the flexible portion 110, may generally be separated into five different portions. Namely, the device 100 may include a first portion 120, a second portion 125, a third portion 130, a fourth portion 135, and a fifth portion 140. The various portions 120/125/130/135/140 may be collectively referred to herein as "portions 120-140." The portions 120-140 may be designated in FIG. 1 by the lateral dashed lines. In some embodiments, the flexible portion 110 may be creased or otherwise have some physical demarcation between portions 120-140. In other embodiments, the flexible portion 110 may have no physical demarcation between portions 120-140.

Generally, the first portion 120 may refer to a portion of the flexible portion 110 along which the rigid portion 105 overlaps as shown in FIG. 1. The second portion 125 may refer to a portion of the flexible portion 110 between rigid portion 105 and rigid portion 115. The third portion 130 may refer to a portion of the flexible portion 110 along which the rigid portion 115 overlaps as shown in FIG. 1. The fourth portion 135 and the fifth portion 140 may refer to portions of the flexible portion 110 along which rigid portions 105 and 115 are not present.

As used herein with respect to FIG. 1, the term "width" may refer to a distance along the axis demarcated "W" in FIG. 1. The term "length" may refer to a distance along the axis demarcated "L" in FIG. 1. The thickness or z-height of the device 100 may refer to a distance along an axis perpendicular to both the W and L axes.

Figure 5:
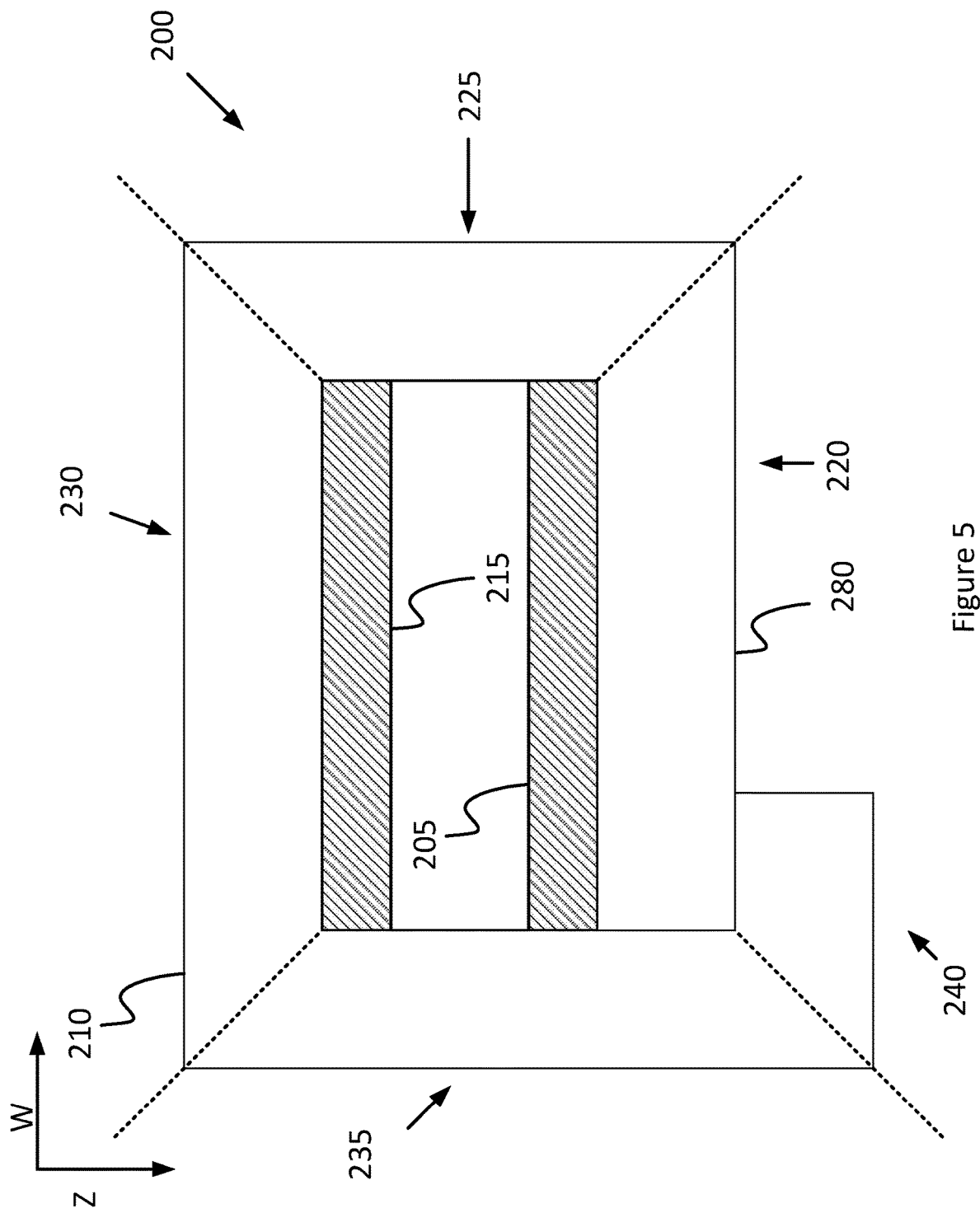
FIG. 5 illustrates a simplified end-on view of an alternative example device subsequent to reshaping, in accordance with various embodiments.

In some embodiments, the first portion and the third portion of the flexible portion may have approximately the same width as shown in FIG. 5. However, in some embodiments the width of the third portion 130 may be approximately equal to the combined width of the first portion 120 and the fifth portion 140, as will be described in further detail with respect to FIGS. 2 and 3. In some embodiments, the second portion 125 and the fourth portion 135 may have approximately the same width.

In some embodiments, the rigid portions 105 and 115 may have the same width as one another. In other embodiments, rigid portion 105 may be wider or narrower than rigid portion 115. In some embodiments, rigid portion 105 may be narrower than the first portion 120 of flexible portion 110, or the combined width of the first portion 120 and the fifth portion 140. In some embodiments, rigid portion 115 may be narrower than the third portion 130.

In embodiments, the device 100 may include one or more EMI spacers such as EMI spacer 165 at one or both ends of the device 100. Generally, the EMI spacer 165 may be formed of a EMI shielding material such as aluminum, copper, or some other material as described above. In the embodiment shown in FIG. 1 where the EMI spacer 165 is positioned in the third portion 130, the EMI spacer may have a height that is approximately equivalent to the second portion 125 of the flexible portion 110, and a width that is approximately equal to the third portion 130. However, it will be understood that in some embodiments the EMI spacer 165 may be coupled with a different portion of the flexible portion 110 such as the second portion 125, the fourth portion 135, or some other portion. In some embodiments the EMI spacer 165 may be relatively thin and have a length on the order of a millimeter to a few millimeters, however in some embodiments the EMI spacer 165 may be longer or shorter. In some embodiments the EMI spacer 165 may not be directly coupled with the flexible portion 110, but rather may be coupled with rigid portion 105 or 115. In some embodiments the EMI spacer 165 may be coupled with a plurality of the portions 120-140, rigid portion 105, or rigid portion 115. Although the EMI spacer 165 is depicted as being set back from the end of the flexible portion 110, in other embodiments the EMI spacer 165 may at least partially extend from the flexible portion 110 on one or both sides of the device 100.

The device 100 may include one or more fiducials 170. As shown in FIG. 1, the fiducials 170 may be located at various points on the flexible portion 110, or in some embodiments the fiducials may be located on the rigid portions 105 or 115. The device 100 may have more or less fiducials 170 than shown in FIG. 1. As used herein, a fiducial may be a marker element that may be made out of a material such as copper, gold, a dielectric material, or some other type of material and positioned on the flexible portion 170 or the rigid portions 105/115. The fiducial may be circular as shown in FIG. 1, or may have some other shape or cross-section such as rectangular, triangular, a star pattern, etc. The fiducial may be used by a human or computer system during the manufacturing process to identify a general orientation and position of the board so that the manufacturing process (e.g., the placement of components on a rigid portion 105/115, the placement of the rigid portions 105/115 on the flexible portion 110, placement of one or more conductive traces or pads on the device 100, etc.) may be performed consistently from device to device.

In some embodiments the device 100, and particularly the fifth portion 140, may include one or more alignment holes 150. The alignment holes 150 may be features in the fifth portion 150 that may allow for better alignment when the device 100 is reshaped, as will be described below. In embodiments, the alignment holes 150 may be laser etched, physically drilled or otherwise cut out, chemically etched, etc. The alignment holes 150 may be generally circular as shown in FIG. 1, while in other embodiments the alignment holes 150 may have a different shape such as square, rectangular, star-shaped, etc.

In some embodiments, the device 100, and particularly the fifth portion 140, may include one or more connection elements 160. Specifically, as shown in FIG. 1, the connection elements 160 may include a plurality of elements. However, in other embodiments, the connection elements 160 may include more or fewer elements or may be a single element. In embodiments, the connection elements may be pads such as gold pads, solder pads, an anisotropic conductive film (ACF), or some other type of pad with a relatively low melting point such that the material can be reflowed subsequent to reshaping (as described in further detail below). In other embodiments, the connection elements may include clips, screws, bolts, rivets, some type of adhesive material that may not require reflow, or some other type of connection element.

Figure 2:
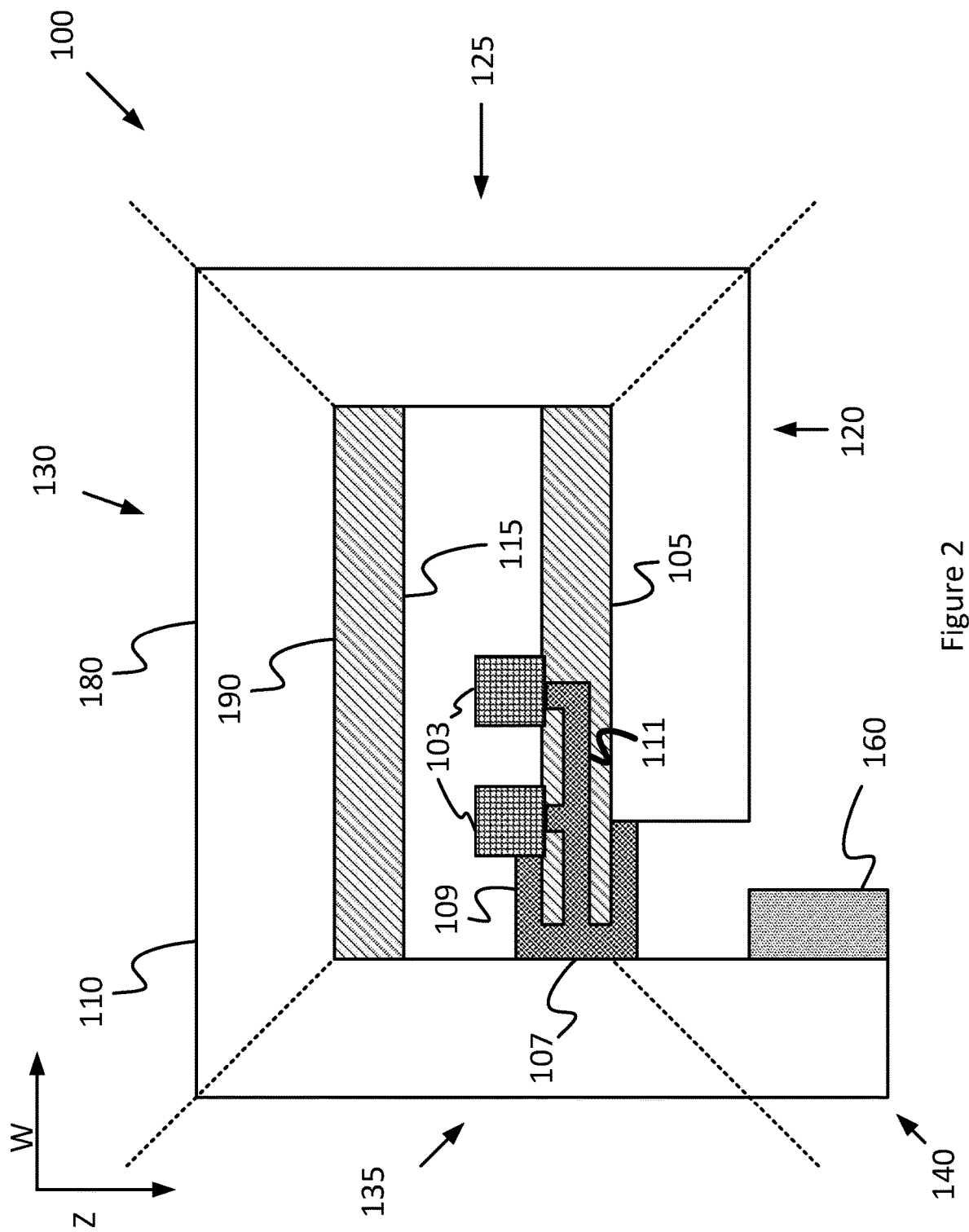
FIG. 2 illustrates a simplified end-on view of the example device of FIG. 1 during reshaping, in accordance with various embodiments.

FIG. 2 illustrates a simplified end-on view of the example device 100 of FIG. 1 during reshaping, in accordance with various embodiments. For the sake of consistency of terminology, the "width" of the device 100 is demarcated by the axis marked "W," The "height" or z-height of the device 100 is demarcated by the axis marked "Z."

In embodiments, the flexible portion 110 may be reshaped to generally from a box-like or rectangular-like shape as shown in FIG. 2. Specifically, the device 100 may be reshaped along the lines indicated by the dashed lines in FIG. 1 such that the first portion 120 is opposite the third portion 130, and the second portion 125 is opposite the fourth portion 135.

The device 100 may be reshaped by a variety of processes. For example, in some embodiments the flexible portion 110 may be reheated and then folded. In other embodiments, the flexible portion 110 may not require heat but instead may be folded without a heating process. In some embodiments, the flexible portion 110 may be otherwise softened such as through application of a chemical reactant such that the flexible portion 110 may be more easily folded. Some embodiments may use some other process, or a combination of various processes.

As can be seen in FIG. 1, the device may be reshaped such that the surface of the flexible portion 110 with which the rigid portion 105 and the rigid portion 115 are coupled is an inner surface 190 of the device. Similarly, the surface of the flexible portion 110 opposite the inner surface 190 may be considered to be an outer surface 180 of the reshaped device 100.

As can be seen in FIGS. 1 and 2, the device 100 may include one or more edge plate portions 107. The edge plate portions 107 may be formed of a conductive material such as copper, gold, or some other conductive material. The edge plate portions 107 may be positioned at an edge of a rigid portion such as rigid portion 105. In embodiments, the edge plate portions 107 may be coupled with, or include, one or more traces such as traces 109 or 111. Trace 109 may be on a surface of the rigid portion 105. Trace 111 may be internal to the rigid portion 105. In embodiments, the traces 109 or 111 may be communicatively coupled with components 103 of the rigid portion 105. In some embodiments, the edge plate portions 107 may be manufactured by creating a row of plated through hole (PTH) vias coupled with internal power, ground, or signal layers of the rigid portion 105. The rigid portion may then be cut (e.g., via mechanical, optical, or chemical means) to expose the PTH vias at the edge of the rigid portion 105.

The edge plate portions 107 may be pre-bent with a flex such as an approximately 90 degree flex as depicted in FIG. 2 such that the edge plate portion 107 couples both with the rigid portion 105 both adjacent to the fourth portion 135 and the first portion 120.

Figure 3:
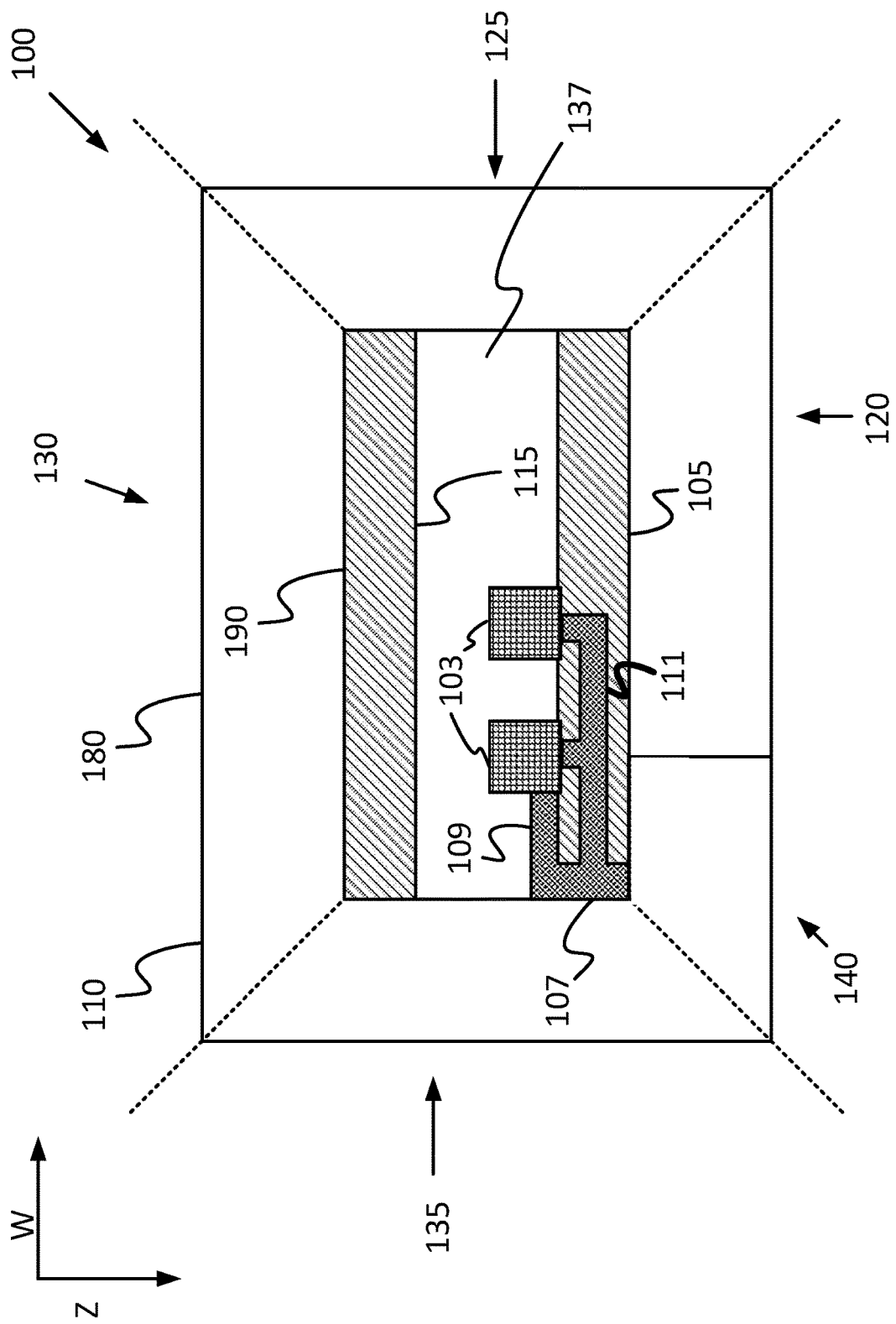
FIG. 3 illustrates a simplified end-on view of the example device of FIG. 1 subsequent to reshaping, in accordance with various embodiments.

When the fifth portion 140 is reshaped such that it is adjacent to the first portion 120 (as shown in FIG. 3 and discussed below), the connection elements 160 may come into contact with the edge plate portion 107. In some embodiments, various of the connection elements 160 or the edge plate portions 107 may be coupled with a variety of the components 103, or coupled with the EMI spacer 165. The connection elements 160, the edge plate portions 107, or the traces 109/111 may act to provide power or ground to the components 103, for example via an on-board power source that is coupled with one of rigid portions 115 or 105 or the flexible portion 110, or an external power source that is coupled with the device 100 via a port as described in further detail below. In other embodiments, the connection elements 160, edge plate portions 107, or the traces 109/111 may carry data signals between components 103 or between a component 103 and another device communicatively coupled with the device 100 via a port as described below. In some embodiments, one or more of the edge plate portions 107 may not be present and the connection element 160 may couple directly with the rigid portion 105.

FIG. 3 illustrates a simplified end-on view of the example device 100 of FIG. 1 subsequent to reshaping, in accordance with various embodiments. The reshaping process may be a reshaping process as discussed above. As can be seen, the fifth portion 140 may be coupled with the rigid portion 105 (for example, via the connection elements 160 or some other technique) and the fifth portion 140 may be adjacent to the first portion 120. Together, the portions 120-140 may define an enclosed area 137 with the rigid portions 105/115 positioned therein. By positioning the rigid portions 105/115 within the enclosed area, the rigid portions 105/115 may be EMI shielded by the flexible portion 110 and, in some embodiments, the EMI spacer 165.

Figure 4:
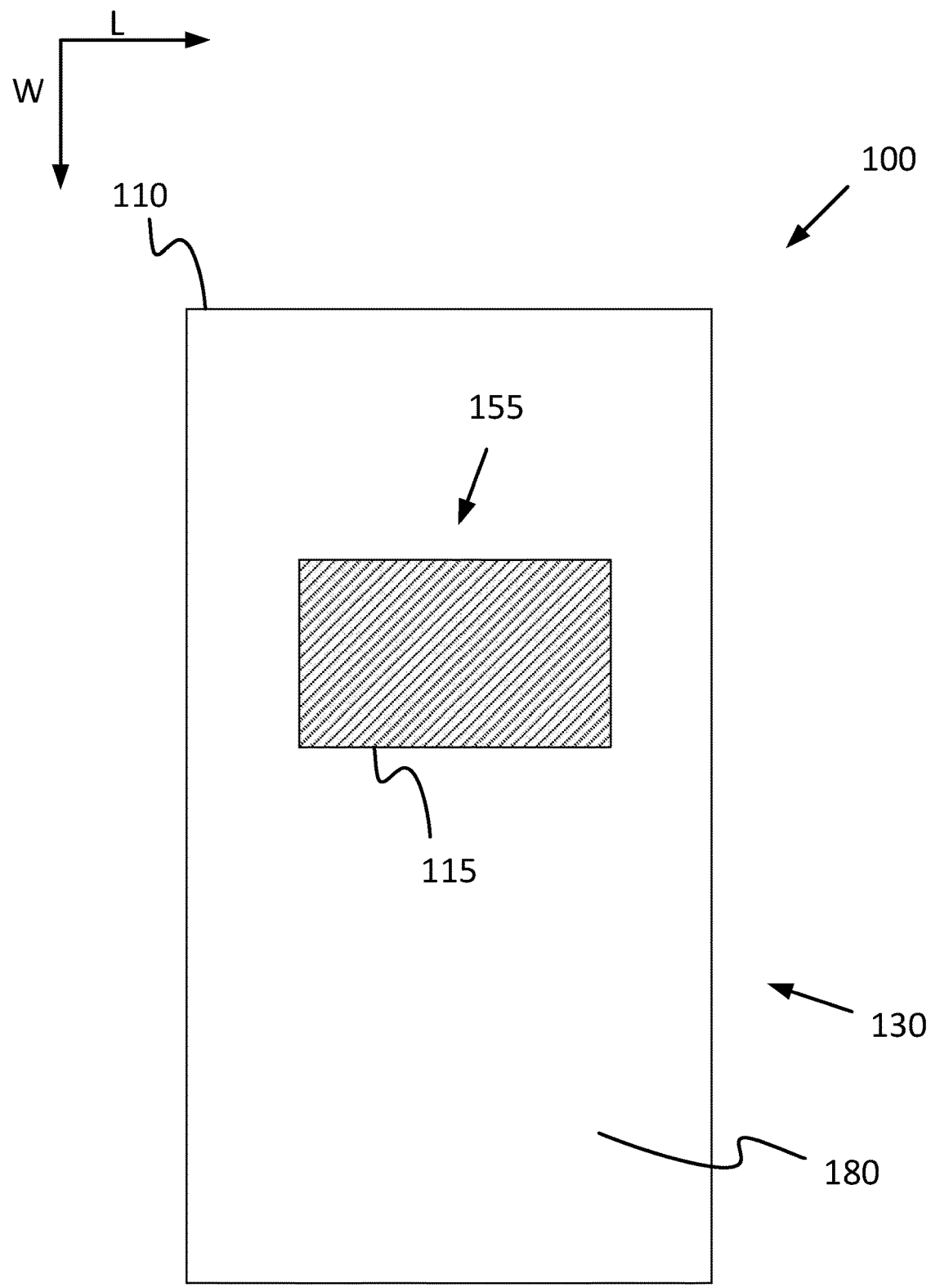
FIG. 4 illustrates a simplified top-down view of the example device of FIG. 1 subsequent to reshaping, in accordance with various embodiments.

FIG. 4 illustrates a simplified top-down view of the device 100 of FIG. 1 subsequent to reshaping, in accordance with various embodiments. In some embodiments, the third portion 180 may have a cutout portion 155 through which the rigid portion 115 may be accessible. In embodiments, the rigid portion 115 may be couplable, via the cutout portion 155, with a thermal solution such as a cooling element (not shown). The cooling element may be, for example, a heat sink, a fan, a vapor chamber, or some other type of cooling element.

FIG. 5 illustrates an alternative example device 200, which may be similar to device 100. The device 200 may have a flexible portion 210, rigid portions 205/215, a first portion 220, a second portion 225, and a third portion 230, which may be respectively similar to flexible portion 110, rigid portions 105/115, first portion 120, second portion 125, and third portion 130. Device 200 may have additional elements such as components, a cutout portion, edge plate portions, an EMI spacer, etc. as depicted with respect to device 100, however those elements may not be depicted in FIG. 5 for the sake of clarity and elimination of redundancy.

As can be seen in FIG. 5, device 200 may include a fourth portion 235 that may be larger than the fourth portion 135 of device 100. In this embodiment, the fifth portion 240 may not be coupled with rigid portion 205, but instead may instead be coupled with the outer surface 280 of first portion 220. The fifth portion 240 may be coupled with the first portion 220 via an adhesive, a solder material, or some other type of connection element such as connection element 160 described above.

It will be understood that the embodiments herein discussed and depicted in FIGS. 1-5 are intended as example embodiments, and other arrangements/configurations of elements may be envisioned. For example, in some embodiments the cutout portion 155 may be located in a different portion 120-140 of the device 100, or there may be more cutout portions or no cutout portion. In some embodiments, the edge plate portions 107 may be coupled with a different part of rigid portion 105, they may be additionally coupled with rigid portion 115, they may not exist, etc. There may be more or less edge plate portions 107, traces 109/111, components 103, rigid portions 105/115, etc. For example, in some embodiments a rigid portion may additionally or alternatively be coupled with the inner surface of the second portion 125/225 or the fourth portion 135/235.

In some embodiments, the portions 120-140 (or equivalent portions of device 200) may generally have a same length as one another. In other embodiments, the flexible portion such as flexible portion 110/210 may not be rectangular, but rather one or more of the portions 120-140 (or equivalent portions of flexible portion 210) may have a greater length than another portion. Similarly, in some embodiments one or more of the rigid portions 105/115/205/215 may have a greater length than the other rigid portion. In some embodiments, the length of the portions of flexible portions 110/210 may be approximately equal to the length of rigid portions 105/115/205/215. In other embodiments, the length of the portions of flexible portions 110/210 may be greater than or less than the length of rigid portions 105/115/205/215.

In embodiments where one or more of the rigid portions 105/115/205/215 is longer than the flexible portion 110/210, there may be one or more additional elements, components, or connectors coupled with the rigid portion 105/115/205/215 at a point that extends beyond the flexible portion 110/210. Conversely, in embodiments where one or more of the portions of flexible portion 110/210 extend beyond another portion of flexible portion 110/210, or extend beyond rigid portions 105/115/205/215, there may be one or more additional elements, components, or connectors coupled with the extended portion of flexible portion 110/210.

In some embodiments, one of the additional connectors may include a port (not shown for clarity) that is operable to communicate with another device that is external to device 100/200. For example, the connector may be operable to transmit/receive power, ground, or data signals to or from another device. In some embodiments, the port may be a universal serial bus (USB) port, a display port, an M.2 socket for a modem, a m.2 socket for a solid state drive (SSD), or some other type of port, socket, or connector.

In some embodiments, even though only five portions 120-140 are depicted in FIG. 1, in other embodiments the flexible portion 110 may have more or less portions. For example, in some embodiments the flexible portion 110 may only have four portions which, when reshaped, may generally have a triangular cross-section when viewed end-on such as in FIG. 2. In some embodiments, there may be additional portions such that the flexible portion 110, when reshaped, may generally have a pentagonal, hexagonal, circular, etc. cross-section.

Figure 6:
FIG. 6 illustrates an example process for generating the example device of FIG. 1 or 5, in accordance with various embodiments.

FIG. 6 illustrates an example process for generating the example device 100 or 200 of FIG. 1 or 5, in accordance with various embodiments. In embodiments, the process may include identifying, at 305, a single EMI shield plate that includes a first surface with a PCB coupled thereto. The single EMI shield plate may be, for example, the flexible portion 110 or 210 described above. The first surface may be, for example, surface 190 (or the equivalent surface of device 200). The PCB may be, for example, rigid portions 105, 115, 205, or 215.

The process may also include reshaping, at 310, the EMI shield plate to form a reshaped single EMI shield plate that defines an enclosed area, wherein the PCB is within the enclosed area. The reshaped single EMI shield plate may be, for example, device 100 as shown in FIG. 3 or 4, or device 200 as shown in FIG. 5. The enclosed area may be, for example, enclosed area 137 of device 100 (or the equivalent area of device 200).

Embodiments herein may provide a variety of benefits. Specifically, by using a reshaped flexible portion, the device 100 or 200 may have a decreased x-y footprint in any device (such as a mobile device, a computer system, etc.) that uses device 100 or 200. For example, use of device 100 or 200 may result in an almost 40% reduction in x-y footprint. Additionally, use of device 100 or 200 may eliminate the need for an additional external EMI shielding can, which may result in significant cost savings. Finally, the reduction in x-y footprint may allow for a larger battery to be used alongside device 100 or 200, resulting in an overall increased battery life for any device that uses device 100 or 200.

Figure 7:
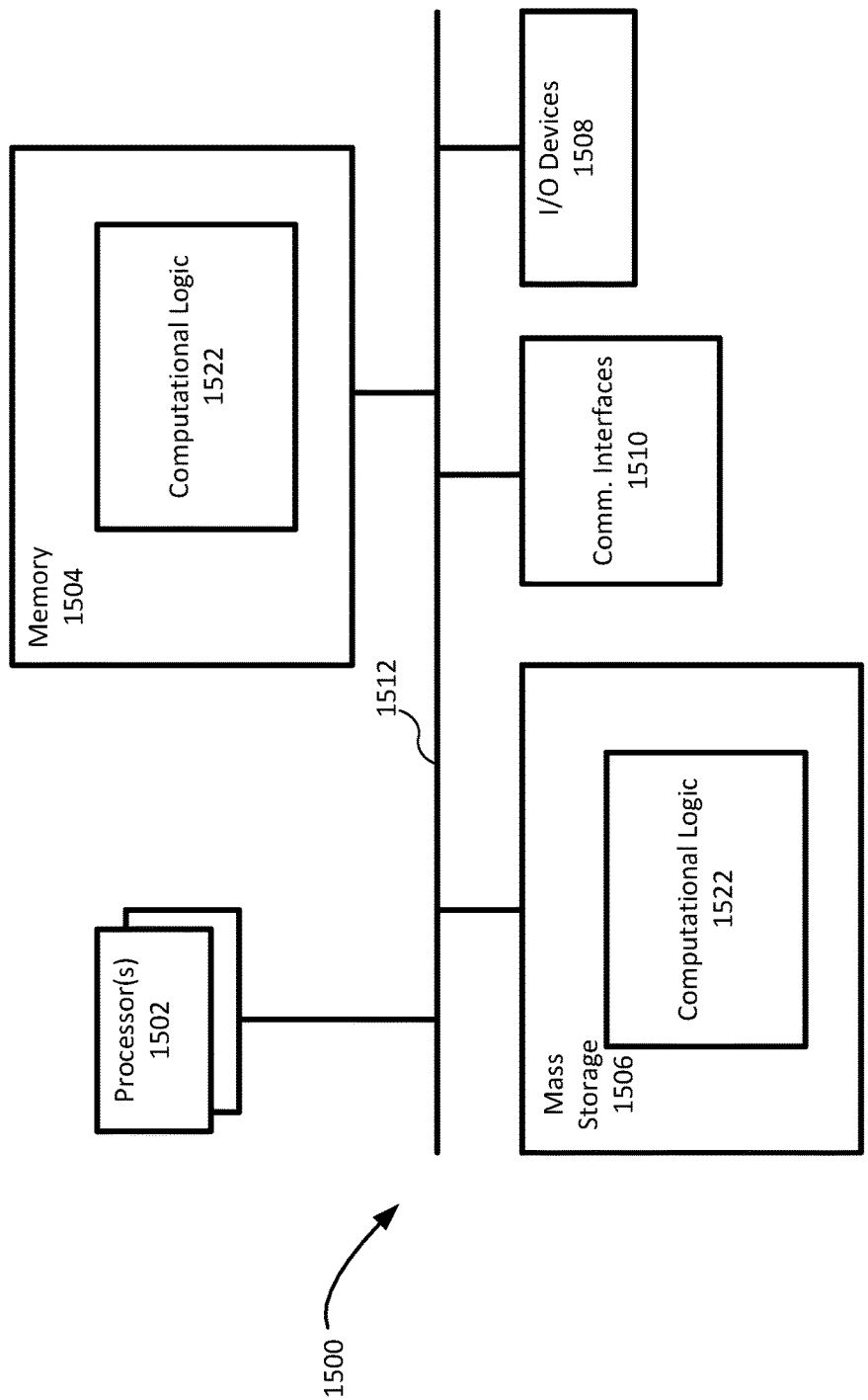
FIG. 7 illustrates an example device, in accordance with various embodiments.

FIG. 7 illustrates an example computing device 1500 suitable for use with devices 100 or 200, in accordance with various embodiments. Specifically, in some embodiments, the computing device 1500 may include device 100 or 200 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a central processing unit (CPU), a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic random-access memory (DRAM), compact disc read-only memory (CD-ROM), digital versatile disk (DVD), and so forth). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth). In some embodiments, the host device 103 may be elements of computing device 1500 such as processor(s) 1502, memory 1504, mass storage 1506, etc.

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

For one embodiment, at least one of processors 1502 may be packaged together with computational logic 1522 configured to practice aspects of optical signal transmission and receipt described herein to form a System in Package (SiP) or a System on Chip (SoC).

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In embodiments, various of the elements described with respect to computing device 1500 may be the components 103 of device 100 or 200. For example, in some embodiments the processor(s) 1502, the memory 1504, the computational logic 1522, or the communications interface 1510 may be one of the components 103. The components may be coupled with another component of computing device 1500 via connection of the above-described port to system bus 1512.

EXAMPLES

Example 1 may include a device comprising: a single electromagnetic interference (EMI) shield plate that defines an enclosed area, wherein the EMI shield plate has an inner surface and an outer surface opposite the inner surface; and a first printed circuit board (PCB) coupled with the inner surface, wherein the first PCB is within the enclosed area.

Example 2 may include the device of example 1, wherein the single EMI shield plate includes: a first portion and a third portion opposite the first portion; and a second portion and a fourth portion opposite the second portion; wherein an inner surface of the first portion, an inner surface of the second portion, an inner surface of the third portion, and an inner surface of the fourth portion define the enclosed area.

Example 3 may include the device of example 2, further comprising a second PCB coupled with the inner surface of the third portion and positioned opposite the first PCB within the enclosed area.

Example 4 may include the device of example 2, wherein the outer surface of the single EMI shield plate includes aluminum.

Example 5 may include the device of example 2, wherein the single EMI shield plate includes a fifth portion that is in a same plane as the first portion, wherein the fifth portion is adjacent to the fourth portion and the first portion, and the fifth portion is coupled with the first PCB.

Example 6 may include the device of example 2, wherein the single EMI shield plate includes a fifth portion that is coupled with an outer surface of the first portion and adjacent to the fourth portion.

Example 7 may include the device of example 2, wherein the second portion is directly adjacent to the first portion and the third portion, and the fourth portion is directly adjacent to the third portion.

Example 8 may include the device of examples 1 or 2, or some other example herein, wherein the single EMI shield plate includes a cutout portion such that a portion of the first PCB is exposed through the cutout portion.

Example 9 may include the device of examples 1 or 2, or some other example herein, further comprising a spacer positioned within the enclosed area at an end of the device.

Example 10 may include the device of examples 1 or 2, or some other example herein, wherein the second portion is directly adjacent to the first portion and the third portion, and the fourth portion is directly adjacent to the third portion.

Example 11 may include a method comprising: identifying a single electromagnetic interference (EMI) shield plate that includes a first surface with a printed circuit board (PCB) coupled thereto, and a second surface opposite the first surface; and reshaping the EMI shield plate to form a reshaped single EMI shield plate that defines an enclosed area, wherein the PCB is within the enclosed area.

Example 12 may include the method of example 11, wherein the first surface is an inner surface of the enclosed area.

Example 13 may include the method of example 11, wherein the reshaped single EMI shield plate includes: a first portion and a third portion opposite the first portion; and a second portion and a fourth portion opposite the second portion; wherein an inner surface of the first portion, an inner surface of the second portion, an inner surface of the third portion, and an inner surface of the fourth portion define the enclosed area.

Example 14 may include the method of example 13, wherein the PCB is a first PCB, and wherein the reshaped single EMI shield plate includes a second PCB coupled with the first surface within the enclosed area.

Example 15 may include the method of example 13, wherein the reshaped single EMI shield plate includes a fifth portion that is in a same plane as the first portion, wherein the fifth portion is adjacent to the fourth portion and the first portion, and the fifth portion is coupled with the first PCB.

Example 16 may include the method of example 13, wherein the reshaped single EMI shield plate includes a fifth portion that is coupled with the second surface at the first portion, and is adjacent to the fourth portion.

Example 17 may include the method of any of examples 11-13, or some other example herein, further comprising positioning a spacer on the first surface of the single EMI shield plate at an end of the single EMI shield plate such that the spacer is within the enclosed area at and end of the reshaped single EMI shield plate when the EMI shield plate is reshaped to form the reshaped single EMI shield plate.

Example 18 may include a computing system comprising: a memory; and a device communicatively coupled with the memory, wherein the device includes: a single electromagnetic interference (EMI) shield plate that defines an enclosed area, wherein the EMI shield plate has an inner surface and an outer surface opposite the inner surface; and a first printed circuit board (PCB) coupled with the inner surface, wherein the first PCB is within the enclosed area.

Example 19 may include the computing system of example 18, wherein the single EMI shield plate includes: a first portion and a third portion opposite the first portion; and a second portion and a fourth portion opposite the second portion; wherein an inner surface of the first portion, an inner surface of the second portion, an inner surface of the third portion, and an inner surface of the fourth portion define the enclosed area.

Example 20 may include the computing system of example 19, further comprising a second PCB coupled with the inner surface of the third portion and positioned opposite the first PCB within the enclosed area.

Example 21 may include the computing system of example 19, wherein the outer surface of the single EMI shield plate includes aluminum.

Example 22 may include the computing system of example 19, wherein the single EMI shield plate includes a fifth portion that is in a same plane as the first portion, wherein the fifth portion is adjacent to the fourth portion and the first portion, and the fifth portion is coupled with the first PCB.

Example 23 may include the computing system of example 19, wherein the single EMI shield plate includes a fifth portion that is coupled with an outer surface of the first portion and adjacent to the fourth portion.

Example 24 may include the computing system of example 19, wherein the second portion is directly adjacent to the first portion and the third portion, and the fourth portion is directly adjacent to the third portion.

Example 25 may include the computing system of examples 18 or 19, or some other example herein, wherein the single EMI shield plate includes a cutout portion such that a portion of the first PCB is exposed through the cutout portion.

Example 26 may include the computing system of examples 18 or 19, or some other example herein, further comprising a spacer positioned within the enclosed area at an end of the device.

Example 27 may include the computing system of examples 18 or 19, or some other example herein, wherein the second portion is directly adjacent to the first portion and the third portion, and the fourth portion is directly adjacent to the third portion.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:
1. A device comprising:
a single electromagnetic interference (EMI) shield plate that defines an enclosed area, wherein the EMI shield plate includes:
an inner surface and an outer surface opposite the inner surface; and a first portion, a second portion, and a third portion opposite the first portion, wherein an inner surface of the first portion, an inner surface of the second portion, and an inner surface of the third portion at least partially define the enclosed area;

a first printed circuit board (PCB) coupled with the inner surface of the first portion within the enclosed area; and a second PCB coupled with the inner surface of the third portion within the enclosed area and opposite the first PCB.

2. The device of claim 1, wherein the single EMI shield plate includes:

a fourth portion opposite the second portion;

wherein an inner surface of the fourth portion further at least partially defines the enclosed area.

3. The device of claim 2, wherein the outer surface of the single EMI shield plate includes aluminum.

4. The device of claim 2, wherein the single EMI shield plate includes a fifth portion that is in a same plane as the first portion, wherein the fifth portion is adjacent to the fourth portion and the first portion, and the fifth portion is coupled with the first PCB.

5. The device of claim 2, wherein the single EMI shield plate includes a fifth portion that is coupled with an outer surface of the first portion and adjacent to the fourth portion.

6. The device of claim 2, wherein the second portion is directly adjacent to the first portion and the third portion, and the fourth portion is directly adjacent to the third portion.

7. The device of claim 1, wherein the single EMI shield plate includes a cutout portion such that a portion of the first PCB is exposed through the cutout portion.

8. The device of claim 1, further comprising a spacer positioned within the enclosed area at an end of the device.

9. The device of claim 1, wherein the second portion is directly adjacent to the first portion and the third portion, and the fourth portion is directly adjacent to the third portion.

10. A method comprising:

identifying a single electromagnetic interference (EMI) shield plate that includes a first surface with a first printed circuit board (PCB) and a second PCB coupled thereto, and a second surface opposite the first surface; and reshaping the EMI shield plate to form a reshaped single EMI shield plate that defines an enclosed area, wherein the reshaped single EMI shield plate includes a first portion, a second portion, and a third portion opposite the first portion, and wherein the first PCB is coupled with the first portion within the enclosed area, and wherein the second PCB is coupled with the third portion within the enclosed area.

11. The method of claim 10, wherein the first surface is an inner surface of the enclosed area.

12. The method of claim 10, wherein the reshaped single EMI shield plate further includes:

a fourth portion opposite the second portion;

wherein an inner surface of the first portion, an inner surface of the second portion, an inner surface of the third portion, and an inner surface of the fourth portion define the enclosed area.

13. The method of claim 12, wherein the first PCB is coupled with the inner surface of the first portion, and the second PCB is coupled with the inner surface of the third portion.

14. The method of claim 12, wherein the reshaped single EMI shield plate includes a fifth portion that is in a same plane as the first portion, wherein the fifth portion is adjacent to the fourth portion and the first portion, and the fifth portion is coupled with the first PCB.

15. The method of claim 12, wherein the reshaped single EMI shield plate includes a fifth portion that is coupled with the second surface at the first portion, and is adjacent to the fourth portion.

16. The method of claim 10, further comprising positioning a spacer on the first surface of the single EMI shield plate at an end of the single EMI shield plate such that the spacer is within the enclosed area at and end of the reshaped single EMI shield plate when the EMI shield plate is reshaped to form the reshaped single EMI shield plate.

17. A computing system comprising:

a memory; and a device communicatively coupled with the memory, wherein the device includes:

a single electromagnetic interference (EMI) shield plate that defines an enclosed area, wherein the EMI shield plate has an inner surface and an outer surface opposite the inner surface, and wherein the EMI shield plate includes a first portion, a second portion, and a third portion opposite the first portion;

a first printed circuit board (PCB) coupled with an inner surface of the first portion; and a second PCB coupled with an inner surface of the third portion opposite the first PCB.

18. The computing system of claim 17, wherein the single EMI shield plate further includes:

a fourth portion opposite the second portion;

wherein the inner surface of the first portion, an inner surface of the second portion, the inner surface of the third portion, and an inner surface of the fourth portion define the enclosed area.

19. The computing system of claim 17, wherein the second portion is directly adjacent to the first portion and the third portion, and the fourth portion is directly adjacent to the third portion.

* * * * *